United States Patent
Liu et al.

(10) Patent No.: US 12,306,123 B2
(45) Date of Patent: May 20, 2025

(54) PREPARATION METHOD AND ANALYSIS METHOD OF MONOLAYER TWO-DIMENSIONAL MATERIALS

(71) Applicant: NATIONAL TAIWAN NORMAL UNIVERSITY, Taipei (TW)

(72) Inventors: Yi-Hsin Liu, Taipei (TW); Kai-Chun Chuang, Taipei (TW); Chi Li, Taipei (TW); Sheng-Chih Hsu, Taipei (TW)

(73) Assignee: NATIONAL TAIWAN NORMAL UNIVERSITY, Taipei (TW)

( * ) Notice: Subject to any disclaimer, the term of this patent is extended or adjusted under 35 U.S.C. 154(b) by 702 days.

(21) Appl. No.: 17/669,386

(22) Filed: Feb. 11, 2022

(65) Prior Publication Data

US 2023/0168214 A1    Jun. 1, 2023

(30) Foreign Application Priority Data

Nov. 29, 2021   (TW) ................................ 110144383

(51) Int. Cl.
*G01N 24/10* (2006.01)
*H01L 21/02* (2006.01)

(52) U.S. Cl.
CPC ....... *G01N 24/10* (2013.01); *H01L 21/02568* (2013.01)

(58) Field of Classification Search
None
See application file for complete search history.

(56) References Cited

U.S. PATENT DOCUMENTS

| 2009/0092539 A1* | 4/2009 | Chung | C09K 11/883 |
| | | | 423/511 |
| 2011/0227007 A1* | 9/2011 | Kang | H01L 21/02601 |
| | | | 252/519.51 |
| 2012/0074361 A1* | 3/2012 | Torimoto | B82Y 30/00 |
| | | | 423/511 |
| 2018/0186639 A1* | 7/2018 | Liu | C09K 11/883 |

FOREIGN PATENT DOCUMENTS

| CN | 101844796 A | 9/2010 | |
| FR | 2966474 A1 * | 4/2012 | ............ B82Y 30/00 |
| TW | 202009459 A | 3/2020 | |
| WO | 2021136043 A1 | 7/2021 | |

* cited by examiner

*Primary Examiner* — John J Figueroa

(57) ABSTRACT

A preparation method of monolayer two-dimensional materials, including the following steps: providing a metal acetate dihydrate, with a general formula $M(CH_3COO)_2 \cdot 2H_2O$, in which M may be metal ion cadmium or zinc. Dissolving the metal acetate dihydrate in ethylene diamine and heating to 60° C. for two hours to form a metal cation precursor solution. Providing a chalcogen element powder, in which the chalcogen element powder is selected from sulfur, selenium, or tellurium. Dissolving the chalcogen element powder and sodium borohydride in ethylene diamine, and standing at room temperature for 24 hours to form a chalcogenide-amine precursor solution. Mixing the metal cation precursor solution with the chalcogenide-amine precursor solution to form a mixed solution. Transferring the mixed solution in a high temperature autoclave for reaction to form the monolayer two-dimensional materials.

7 Claims, 5 Drawing Sheets

PREPARATION METHOD AND ANALYSIS METHOD OF MONOLAYER TWO-DIMENSIONAL MATERIALS

FIELD OF THE INVENTION

The present invention relates to a material applied in the field of quantum optics, and more particularly to a preparation method of quantum semiconductor material and a measurement method of analyzing the spin properties and spintronics of the material.

BACKGROUND OF THE INVENTION

Two-dimensional (2D) materials with flat shapes and uniform thicknesses, such as nanosheets, nanoplates, quantum well, and quantum belts, have attracted a large amount of attention due to the extraordinary optical properties as well as strong quantum confinement in the vertical direction. Current methods to grow 2D nanosheets mainly rely on gas-phase chemical vapor deposition (CVD) and solution processes, while large-scale synthesis is still under investigation.

Cadmium selenides, one of the most recognized semiconductors for optical and catalytic applications, have been synthesized in various desired morphologies, including molecular nanoclusters, 0D nanoparticles, 1D nanowires, and 2D nanosheets. Thus, colloidal 2D nanosheets are of particular interest for tunable thickness, few defects, enhanced quantum yield, giant oscillator strength transition (GOST), and emission properties for nanolasing and piezoelectric purposes. For merits of 2D materials, the oscillator strength may also give rise to a strong light-matter interaction, resulting in enhanced quantum optical effects and spintronic resonance effects.

However, the 2D nanosheets produced in the prior art need to exhibit spintronics properties suitable for applications in the field of quantum optics at extremely low temperatures. When it is used as a quantum material, it must consume a lot of energy and cost to maintain the ambient temperature.

SUMMARY OF THE INVENTION

The present invention provides a preparation method of a monolayer two-dimensional (2D) material, which is synthesized by a one-step chemical solvothermal method. There is no need to use special selenium precursors or toxic carbon monoxide gas in the synthesis process. The prepared monolayer two-dimensional material has high crystallinity and adjustable manganese doping concentration, and may exhibit quantum properties of light and matter such as spin and spintronics at room temperature and low magnetic field.

The present invention provides an analysis method of monolayer two-dimensional material, which prepares sample with directional alignment by spin coating method, and a resonance spectrum under vertical and parallel magnetic fields is measured by electron paramagnetic resonance spectrometer. By measuring the spin resonance magnetic field spectrum, the energy difference between the different spin states of the electron under the zero magnetic field may be analyzed. Obtain the electronic transition spin spectrum of the material with a magnetic circular dichroism spectrometer at room temperature and low magnetic field (−0.8 T−+0.8 T). The Gaussian function was used to fit the transition absorption half-width of the magneto-optical activity and the absorption difference between the left and right-handed light, and then the Zeeman splitting energy under the magnetic field was calculated. The proportional relationship between the energy and the magnetic field is called the effective Lande g-factor, and its magnitude represents the spin reversal accompanying the electronic transition and the relative polarization ability of the magnetic field.

Other advantages and objects of the invention may be further illustrated by the technical features broadly embodied and described as follows.

In order to achieve one or a portion of or all of the objects or other objects, a preparation method of a monolayer two-dimensional material provided in an embodiment of the invention includes the following steps: providing a metal acetate dihydrate, with a general formula $M(CH_3COO)_2 \cdot 2H_2O$, in which M is metal ion cadmium or zinc. Dissolving the metal acetate dihydrate in ethylene diamine and heating to 60° C. for two hours to form a metal cation precursor solution. Providing a chalcogen element powder, in which the chalcogen element powder is selected from sulfur, selenium, or tellurium. Dissolving the chalcogen element powder and sodium borohydride in ethylene diamine, and standing at room temperature for 24 hours to form a chalcogenide-amine precursor solution. Mixing the metal cation precursor solution with the chalcogenide-amine precursor solution to form a mixed solution. Transferring the mixed solution in a high temperature autoclave for reaction to form the monolayer two-dimensional materials.

In one embodiment of the invention, the method of forming the metal cation precursor solution includes dissolving manganese acetate tetrahydrate and metal acetate dihydrate in ethylenediamine at 60° C.

In one embodiment of the invention, a manganese doping molar concentration percentage in the metal cation precursor solution is between 0-15%.

In one embodiment of the invention, the preparation method of the monolayer two-dimensional material further includes mixing the monolayer two-dimensional material with trioctyl phosphine in an oxygen-free environment for purification treatment.

In one embodiment of the invention, the method of purification treatment includes after mixing the monolayer two-dimensional material with trioctyl phosphine, adding dimethylformamide, and repeating centrifugal treatment 3-4 times.

In one embodiment of the invention, the method of purification treatment further includes after repeating the centrifugal treatment 3-4 times, adding ethanol, and repeating the centrifugal treatment 3-4 times again, and then vacuum drying is used.

In one embodiment of the invention, the method of transferring the mixed solution in the high temperature autoclave for reaction includes carrying out the reaction at 120° C.-250° C.

In order to achieve one or a portion of or all of the objects or other objects, a method of measuring anisotropic of a monolayer two-dimensional material with electron paramagnetic resonance spectrometer provided in an embodiment of the invention includes the following steps: providing a monolayer two-dimensional material prepared by the above-mentioned preparation method. Dispersing the monolayer two-dimensional material uniformly in ethanol to form a measurement sample. Spin coating or drip coating the measurement sample on a slide glass, and placing in a measuring tube of an electron paramagnetic resonance spectrometer. Adjust the measuring tube to make the measurement sample on the slide glass is perpendicular or parallel to a magnetic field. Measuring the measurement sample with the electron paramagnetic resonance spectrometer.

In one embodiment of the invention, the method of spin coating or drip coating the measurement sample on the slide glass includes dropping 3-10 drops of the measurement sample directly on the slide glass, or the spin coating method is repeated 10-100 times to be disposed on the slide glass.

In order to achieve one or a portion of or all of the objects or other objects, an analysis method of the monolayer two-dimensional material provided in an embodiment of the invention includes the following steps: providing the monolayer two-dimensional material prepared by the above-mentioned preparation method. Dispersing the monolayer two-dimensional material uniformly in ethanol to form a measurement sample. Coating the measurement sample by a spin coating method at a rotation speed of 3000 RPM-5000 RPM, and 10-100 drops of the measurement sample are dropped on the slide glass to complete a configuration of the measurement sample with directional alignment on the slide glass. Placing the slide glass in a magnetic circular dichroism spectrometer, and measuring an absorbance of left-handed polarized light and right-handed polarized light of the measurement sample under a magnetic field of −0.8T−+0.8 T. Using Gaussian function to analyze the absorbance of different wavelengths by electron transition overlap method, obtaining an intensity and a half-width of a magneto-optical transition absorption peak. Deriving a Zeeman splitting energy under the magnetic field from the intensity and the half-width of the magneto-optical transition absorption peak. Plotting the Zeeman splitting energy and the magnetic field to find a linear relationship, and a slope of the linear relationship is an effective Lande g factor under the magneto-optical transition.

The preparation method of the monolayer two-dimensional material of the embodiment of the invention uses high temperature solvent method to synthesize a highly crystalline organic-inorganic composite monolayer two-dimensional material with ethylenediamine and metal precursors, effectively doping with four-coordinated manganese ions as the magneto-optical active spin center, and uses the coating method to make the monolayer two-dimensional material form a measurement sample with directional alignment. The electron paramagnetic resonance spectrometer measures the above-mentioned measurement sample with directional alignment in a vertical or parallel magnetic field. The spin center exhibits a high zero-field splitting energy and anisotropic resonance absorption energy spectrum. The measurement of the magnetic circular dichroism spectrum may infer a resonance energy that changes with the magnetic field. Four-coordinated manganese ions have a strong Zeeman effect in the monolayer two-dimensional material, which represents the magneto-optical properties of effectively flipping spin electrons at room temperature and in a low magnetic field.

Other objectives, features and advantages of the invention will be further understood from the further technological features disclosed by the embodiments of the invention wherein there are shown and described preferred embodiments of this invention, simply by way of illustration of modes best suited to carry out the invention.

BRIEF DESCRIPTION OF THE DRAWINGS

The present invention will become more readily apparent to those ordinarily skilled in the art after reviewing the following detailed description and accompanying drawings, in which.

DETAILED DESCRIPTION OF PREFERRED EMBODIMENTS

Figure 1:
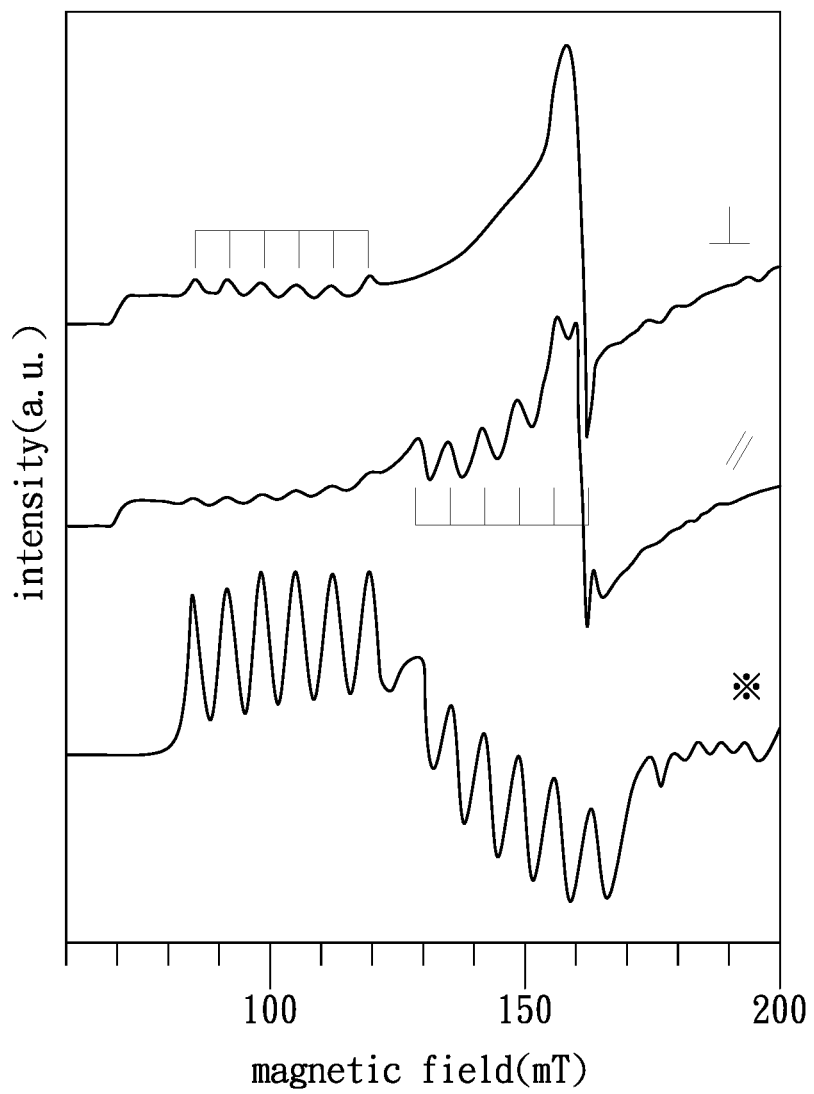
FIG. 1 shows a direction-dependent electron paramagnetic resonance spectrum of a manganese ion doped monolayer two-dimensional material.

The present invention will now be described more specifically with reference to the following embodiments, but the present invention is not limited to the scope of the described examples. The experimental methods without specific conditions in the following examples are selected in accordance with conventional methods and conditions, or in accordance with the product specification.

In order to make the effects of the present invention easier to understand, the following provides specific examples, as well as the detection methods and results of the examples, but they are not intended to limit the present invention.

Embodiment 1

Preparation method of monolayer two-dimensional material of the invention.

A monolayer two-dimensional material of the invention basically needs to be prepared in a glove box with a closed container filled with nitrogen and a low dissolved oxygen content (<10 ppm) during the preparation process. A starting material of the embodiment is metal acetate dihydrate, with a general formula $M(CH_3COO)_2 \cdot 2H_2O$, in which M is a metal cation. More specifically, M is, for example, cadmium or zinc, but it is not limited thereto. In one embodiment, cadmium metal acetate dihydrate ($Cd(OAc)_2 \cdot 2H_2O$) (3.00 mmol) or zinc metal acetate dihydrate ($Zn(OAc)_2 \cdot 2H_2O$) (3.00 mmol) is weighed in a sample bottle, and a magnet is added to help stir evenly, then use ethylenediamine (0.52 mol) to dissolve it, and heat to 60° C. for two hours. The heating step may help cadmium metal acetate dihydrate or zinc metal acetate dihydrate to dissolve in ethylenediamine, and after two hours of reaction, it will return to room temperature. At this time, it would be a white turbid solution, which is a metal cation precursor solution.

On the other hand, dissolve chalcogen powder (5.40 mmol) and sodium borohydride (5.40 mmol) in ethylenediamine (0.022 mol). The chalcogen element powder in the invention refers to the powder of sulfur, selenium or tellurium in the chalcogen element. Sodium borohydride acts as a reducing agent to activate chalcogen elements. Ethylenediamine acts as a solvent for dissolution on the one hand, and as a ligand for the material on the other hand. Standing at room temperature for 24 hours. In the embodiment, when selenium powder is used, a color of the solution will gradually change from original black solution to a dark green solution, and finally become a transparent and colorless solution. It should be understood that when different chalcogen elements are used, the color of the solution may change differently. From the above-mentioned color change of the solution, the oxidation state of sulfur, selenium or tellurium may be initially understood from (0) to (−2) due to the addition of sodium borohydride. The transparent solution synthesized here is called a chalcogen element precursor solution.

In the embodiment, the metal cation in the metal cation precursor solution is cadmium as an example, and the chalcogen element in the chalcogen element precursor solution is selenium as an example. However, the above-mentioned embodiments are not intended to limit the scope of the invention. The prepared chalcogen element precursor solution is added to the metal cation precursor solution to form a mixed solution. The color of the mixed solution is yellow-green. After fully stirring for 24 hours at room temperature, the mixed solution turned white, and the components contained in the solution are organic-inorganic $CdSe(en)_{0.5}$, in which "en" is the abbreviation of ethylenediamine, representing the inorganic cadmium selenide dispersed in the ethylenediamine solvent. After that, put the mixed solution in a sample bottle in an autoclave and seal it tightly. After sending it out of the glove box, the reaction is carried out at 120° C.-250° C. in a temperature-controlled reactor, which is the well-known solvothermal method in the prior art. Solvothermal method refers to a synthetic method in which the original mixture is reacted in a closed system, such as an autoclave, etc., using organic or non-aqueous solvents as solvents at a certain temperature and autogenous pressure of the solution. It differs from the hydrothermal reaction in that the solvent used is organic instead of water. In the embodiment, the solvent used is ethylenediamine. After 24 hours of reaction, a monolayer two-dimensional material with stable structure is formed. The chemical formula is $ME(en)_{0.5}$, in which M is cadmium or zinc, and E is sulfur, selenium or tellurium. In the embodiment, $CdSe(en)_{0.5}$ is taken as an example. The monolayer two-dimensional material is the final product of the invention.

After the high-temperature reaction, the monolayer two-dimensional material is returned to the glove box, and the product of the monolayer two-dimensional material is mixed with trioctyl phosphine under a nitrogen (oxygen-free) environment. Since a synthesis ratio used in the invention is that excess chalcogen element precursor solution (selenium) reacts with metal cation precursor solution (cadmium), in order to avoid obtaining a mixture of monolayer two-dimensional material product $CdSe(en)_{0.5}$ and selenium powder in the final product, tri-n-octylphosphine (TOP), a strong Lewis base, is added to form a soluble compound with elemental selenium to remove unreacted selenium powder in the subsequent purification process.

A purification method selects an aprotic solvent N,N-dimethylformide (DMF) and the appropriate amount of product in a centrifuge tube. A soluble by-product selenium-trioctylphosphine is soluble in the aprotic solvent. The product is separated from the solvent by centrifugation (6500 rpm, 10 min) to remove the by-product in the reaction. The centrifugation process is repeated 3 to 4 times to surely remove the by-product of the reaction and unreacted precursors. Finally, ethanol is added for cleaning, and centrifuge about 3 to 4 times to remove the remaining dimethylformamide. Finally, the purified monolayer two-dimensional material is obtained by vacuum drying, which is a solid powder.

Embodiment 2

Preparation method of manganese ion doped monolayer two-dimensional material.

The monolayer two-dimensional material of the embodiment further includes manganese ion doping. The preparation process basically needs to be prepared in a glove box with a closed container filled with nitrogen and a low dissolved oxygen content. A starting material of the embodiment is manganese acetate tetrahydrate $(Mn(OAc)_2 \cdot 4H_2O)$ and metal acetate dihydrate, in which M is a metal cation. More specifically, M is, for example, cadmium or zinc, but it is not limited thereto. A manganese doping molar concentration percentage is, for example, between 0-15%. Specifically, three different concentrations of 0.5% (0.015 mmol), 4.0% (0.120 mmol) and 7.7% (0.231 mmol) are added according to the ratio of manganese/cadmium or manganese/zinc. In one embodiment, manganese acetate tetrahydrate $(Mn(OAc)_2 \cdot 4H_2O)$ and cadmium metal acetate dihydrate $(Cd(OAc)_2 \cdot 2H_2O)$ (3.00 mmol) or manganese acetate tetrahydrate $(Mn(OAc)_2 \cdot 4H_2O)$ and zinc metal acetate dihydrate $(Zn(OAc)_2 \cdot 2H_2O)$ (3.00 mmol) is weighed in a sample bottle, and a magnet is added to help stir evenly, then use ethylenediamine (0.52 mol) to dissolve it, and heat to 60° C. for two hours. The heating step may help manganese acetate tetrahydrate and cadmium metal acetate dihydrate or manganese acetate tetrahydrate and zinc metal acetate dihydrate to dissolve in ethylenediamine, and after two hours of reaction, it will return to room temperature. At this time, it would be a white turbid solution, which is a manganese ion doped metal cation precursor solution. Depending on the material used, it may be a manganese/cadmium precursor with a general formula $Mn_xCd_{1-x}Se(en)_{0.5}$ or a manganese/zinc precursor with a general formula $Mn_xZn_{1-x}Se(en)_{0.5}$, in which x is 0-15%.

On the other hand, dissolve chalcogen powder (5.40 mmol) and sodium borohydride (5.40 mmol) in ethylenediamine (0.022 mol). The chalcogen element powder in the invention refers to the powder of sulfur, selenium or tellurium in the chalcogen element. Sodium borohydride acts as a reducing agent to activate chalcogen elements. Ethylenediamine acts as a solvent for dissolution on the one hand, and as a ligand for the material on the other hand. Standing at room temperature for 24 hours. In the embodiment, when selenium powder is used, a color of the solution will gradually change from original black solution to a dark green solution, and finally become a transparent and colorless solution. It should be understood that when different chalcogen elements are used, the color of the solution may change differently. From the above-mentioned color change of the solution, the oxidation state of sulfur, selenium or tellurium may be initially understood from (0) to (−2) due to the addition of sodium borohydride. The transparent solution synthesized here is called a chalcogen element precursor solution.

In the embodiment, the metal cation in the manganese ion doped metal cation precursor solution is cadmium as an example, and the chalcogen element in the chalcogen element precursor solution is selenium as an example. However, the above-mentioned embodiments are not intended to limit the scope of the invention. The prepared chalcogen element precursor solution is added to the manganese ion doped metal cation precursor solution to form a mixed solution. The color of the mixed solution is yellow-green. After fully stirring for 24 hours at room temperature, the mixed solution turned white, and the components contained in the solution are organic-inorganic $Mn_xCd_{1-x}Se(en)_{0.5}$, in which "en" is the abbreviation of ethylenediamine, representing the inorganic manganese ion doped cadmium selenide dispersed in the ethylenediamine solvent. After that, put the mixed solution in a sample bottle in an autoclave and seal it tightly. After sending it out of the glove box, the reaction is carried out at 120° C.-250° C. in a temperature-controlled reactor, which is the well-known solvothermal method in the prior art. Solvothermal method refers to a synthetic method in which the original mixture is reacted in a closed system, such as an autoclave, etc., using organic or non-aqueous solvents as solvents at a certain temperature and autogenous pressure of the solution. It differs from the hydrothermal reaction in that the solvent used is organic instead of water. In the embodiment, the solvent used is ethylenediamine. After 24 hours of reaction, a monolayer two-dimensional material with stable structure is formed. The chemical formula is $Mn_xM_{1-x}E(en)_{0.5}$, in which M is cadmium or zinc, and E is sulfur, selenium or tellurium. In the embodiment, $Mn_xCd_{1-x}Se(en)_{0.5}$ is taken as an example. The manganese ion doped monolayer two-dimensional material is the final product of the invention.

After the high-temperature reaction, the manganese ion doped monolayer two-dimensional material is returned to the glove box, and the product of the manganese ion doped monolayer two-dimensional material is mixed with trioctyl phosphine under a nitrogen (oxygen-free) environment. Since a synthesis ratio used in the invention is that excess chalcogen element precursor solution (selenium) reacts with manganese ion doped metal cation precursor solution (cadmium), in order to avoid obtaining a mixture of manganese ion doped monolayer two-dimensional material product $Mn_xCd_{1-x}Se(en)_{0.5}$ and selenium powder in the final product, tri-n-octylphosphine (TOP), a strong Lewis base, is added to form a soluble compound with elemental selenium to remove unreacted selenium powder in the subsequent purification process.

A purification method selects an aprotic solvent N,N-dimethylformide (DMF) and the appropriate amount of product in a centrifuge tube. A soluble by-product selenium-trioctylphosphine is soluble in the aprotic solvent. The product is separated from the solvent by centrifugation (6500 rpm, 10 min) to remove the by-product in the reaction. The centrifugation process is repeated 3 to 4 times to surely remove the by-product of the reaction and unreacted precursors. Finally, ethanol is added for cleaning, and centrifuges about 3 to 4 times to remove the remaining dimethylformamide. Finally, the purified manganese ion doped monolayer two-dimensional material is obtained by vacuum drying, which is a solid powder.

Embodiment 3

Measurement of directional monolayer two-dimensional materials with electron paramagnetic resonance spectrometer.

Electron paramagnetic resonance (EPR) spectrometer, also known as electron spin resonance spectrometer, uses microwave radiation to detect substances with unpaired electrons. According to the electron spin characteristics of $+\frac{1}{2}$ and $-\frac{1}{2}$, when an external magnetic field is applied, there will be a difference between the two energy states. As the intensity of the applied magnetic field increases, the energy difference between the energy levels expands until it matches the microwave radiation, and results in the absorption of photons. Electron paramagnetic resonance spectrometer usually changes the magnetic field and maintains the microwave frequency to measure the magnetic resonance phenomenon of unpaired electrons under the magnetic field.

The material used for measurement in the embodiment is the product manganese ion doped monolayer two-dimensional material in the above-mentioned Embodiment 2, taking the general formula $Mn_xCd_{1-x}Se(en)_{0.5}$ as an example. The material is a two-dimensional quantum structure, and the two-dimensional material is doped with divalent manganese ions with unpaired electrons. Since spin electrons are restricted to the X, Y, and Z bond spaces, they are not only directional, but the effective Lande factor g values ($\Delta E = g\beta eB$, $\Delta E$ is the microwave radiation energy, $\beta e$ is the magnetic element of the electronic wave, B is the magnetic field, and the g value represents the relationship between the resonance energy required for the electron spin flip under the magnetic field) measured in the spin state under different magnetic field directions are also different (difference of energy level splitting state under magnetic field). It also means that the electron spin is subject to the force of the orbit and other electron coupling. Therefore, the electron paramagnetic resonance spectrum of measuring the directional sample may confirm that the two-dimensional material has anisotropic bonding.

In general sample measurement, an appropriate amount of the manganese ion doped monolayer two-dimensional material of solid powder is taken as the sample and placed in the measuring tube of the electron paramagnetic resonance spectrometer. The measuring tube is, for example, a quartz tube, but not limited thereto.

On the other hand, in the measurement of directional samples, a rectangular slide glass is first cut into elongated shapes, and the provided manganese ion doped monolayer two-dimensional material of solid powder is uniformly dispersed in ethanol, and diluted to an appropriate concentration to form a measurement sample. Use the drip method to drop about 3-10 drops of the measurement sample onto the elongated slide glass, or use the spin coating method to drop it onto the elongated slide glass and then air dry until there is a layer of white measurement sample on the slide glass. Put the slide glass containing the measurement sample into the measuring tube of the electron paramagnetic resonance spectrometer, that is, the above-mentioned quartz tube. Adjust and rotate the measuring tube so that the measurement sample on the slide glass is perpendicular or parallel to the magnetic field, and the electronic paramagnetic resonance spectrometer is used to measure the measurement sample to complete the experiment of measuring the directional sample.

Figure 2:
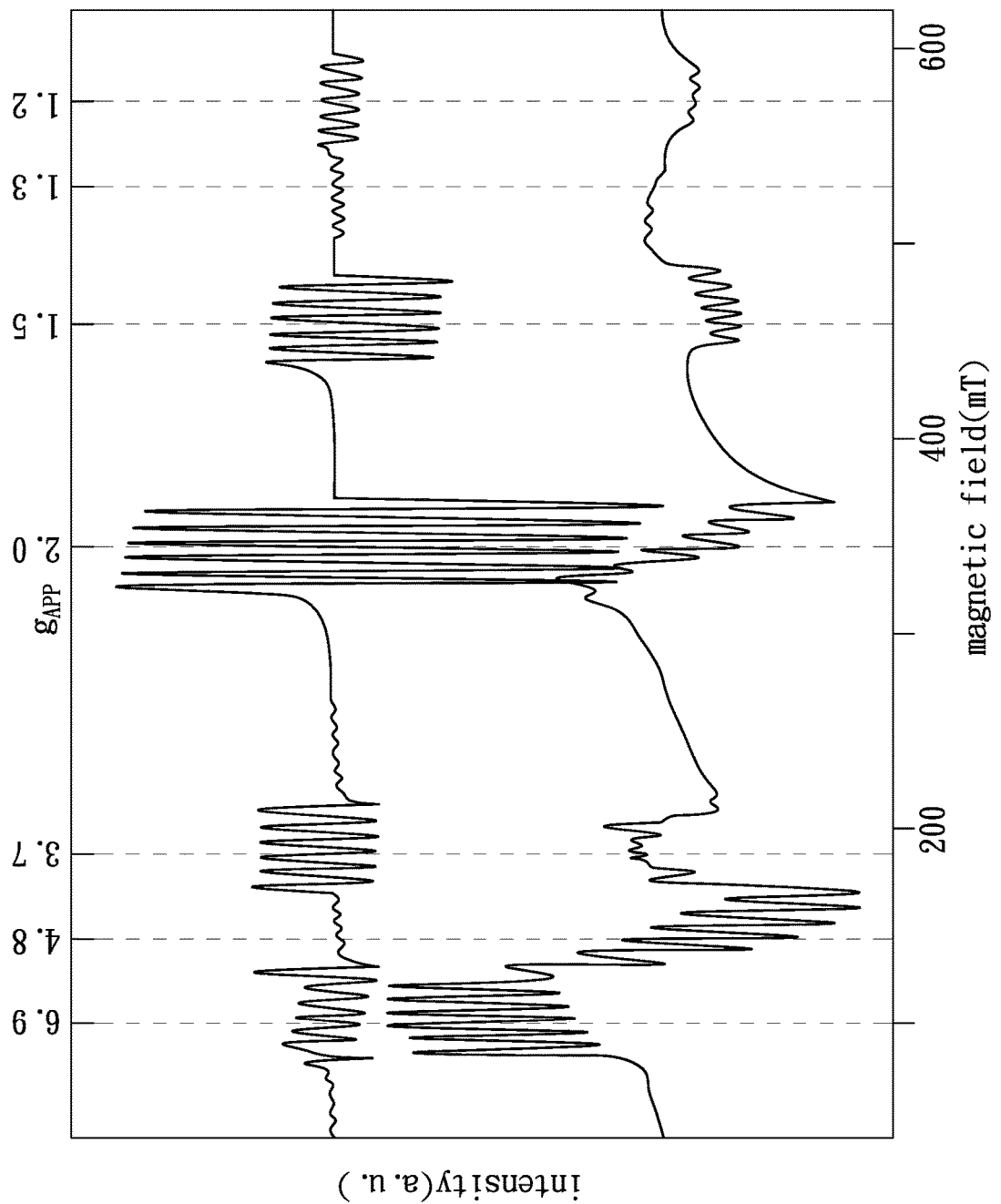
FIG. 2 is a schematic diagram of a spectrum simulation of a manganese ion doped monolayer two-dimensional material measurement sample in a S=5/2 spin system.
Figure 3:
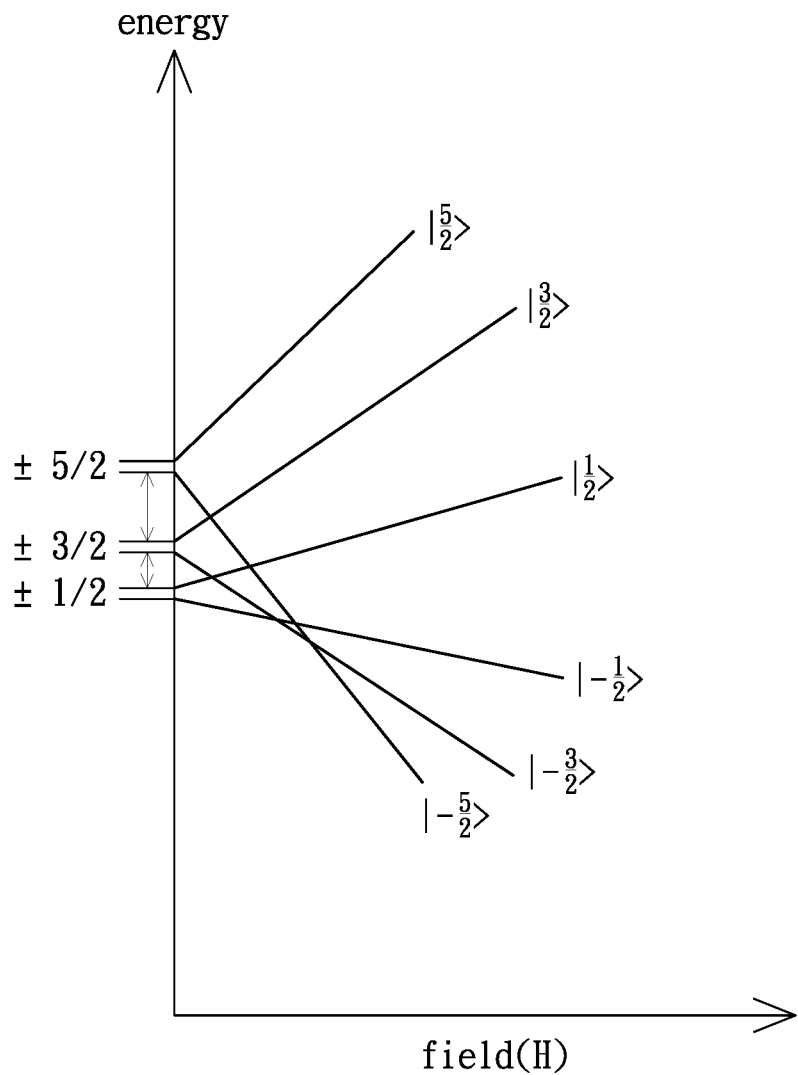
FIG. 3 is a schematic diagram showing an energy level of a $3d^5$ spin system of Kramer's doublets.

The experimental results are shown in FIG. 1. FIG. 1 shows a direction-dependent electron paramagnetic resonance spectrum of a manganese ion doped monolayer two-dimensional material $Mn_xCd_{1-x}Se(en)_{0.5}$ with manganese doping concentration x=0.5% at 4K (temperature), in which ※ represents the measurement of a non-directional powder sample, // represents the measurement of a directional sample parallel to the magnetic field, and ⊥ represents the measurement of a directional sample perpendicular to the magnetic field. The X-axis of FIG. 1 is the magnitude of the magnetic field, and the Y-axis is the intensity. The directional electron paramagnetic resonance spectra in different directions in FIG. 1 may confirm that the two-dimensional material has bonding anisotropy. FIG. 2 shows the spectrum and simulation results (upper line) of a manganese ion doped monolayer two-dimensional material measurement sample in a S=5/2 spin system at 4K. The X-axis of FIG. 2 is the magnitude of the magnetic field, and the Y-axis is the intensity. The spectral simulation results in FIG. 2 may obtain a zero-field-splitting parameter (D value) given in the spin Hamiltonian, and its magnitude is 3850 MHz. The X-axis of FIG. 3 is the magnitude of the applied magnetic field, and the Y-axis is the energy of different spin states. FIG. 3 is a schematic diagram showing an energy level of a 3d⁵ spin system of Kramer's doublets, the relationship between the energy difference between different spin states (±1/2, ±3/2, ±5/2) and the magnetic field, and using the spectral simulation D value results of FIG. 2 to calculate the energy difference of ±1/2→±3/2 and ±3/2→±5/2 (2D and 4D values) under zero magnetic field.

Embodiment 4

Spintronics analysis method of monolayer two-dimensional materials.

Magnetic circular dichroism (MCD) spectrometer is an instrument that uses circularly polarized light to study the transition between electronic states. From a magnetic circular dichroism spectrum, it may be observed that the visible light and ultraviolet light of different energy in the oriented magnetic field have different absorption intensity differences between the left circularly polarized (LCP) light and the right circularly polarized (RCP) light. The difference value may be used to estimate the magnitude of Zeeman splitting under the magnetic field. When preparing the sample of the magnetic circular dichroism spectrometer, the measurement method of the magnetic circular dichroism spectrometer is limited to the absorption spectrum, so the powder sample needs to be prepared in the form of a thin film, and it should not be too thick to make the light impenetrable, nor too thin to make the sample too less and the signal weak.

In the embodiment, The material used for measurement is the product manganese ion doped monolayer two-dimensional material in the above-mentioned Embodiment 2, taking the general formula $Mn_xCd_{1-x}Se(en)_{0.5}$ as an example. The material is a two-dimensional quantum structure, doped with divalent manganese ions with unpaired electrons to bond on a two-dimensional monolayer plane. The manganese ion doped monolayer two-dimensional material of solid powder is uniformly dispersed in ethanol to form a measurement sample. On the other hand, a square quartz cover glass is provided, which is shook and washed 3 times with ethanol and isopropanol each and dried to ensure that the square quartz cover glass will not be contaminated. Place the cleaned square quartz cover glass on a spin coater and spin coating at a rotation speed of 3000 RPM-5000 RPM. Then draw a small amount of the measurement sample, drop about 10-100 drops onto a surface of the square quartz cover glass, and dry it by rotating to complete the preparation of the measurement sample.

Next, put the square quartz cover glass into the magnetic circular dichroism spectrometer, and measure the difference in the absorbance of left-handed polarized light to right-handed polarized light under different magnetic fields. The magnetic field used in the embodiment ranges from −0.8T−+0.8T.

After the measurement, the Gaussian function is used to analyze the overlap of electronic transitions in the spectrum for the absorbance of different wavelengths. Quantum materials have a complex energy level system, and the absorption energy and the intensity of electronic transitions thereof may be known from the absorption spectrum. Therefore, the overlap method may be used to fit the characteristic peaks of different electronic transitions, and the Gaussian function may represent the intensity and the half-width of the absorption peak of the electronic transitions.

Figure 4:
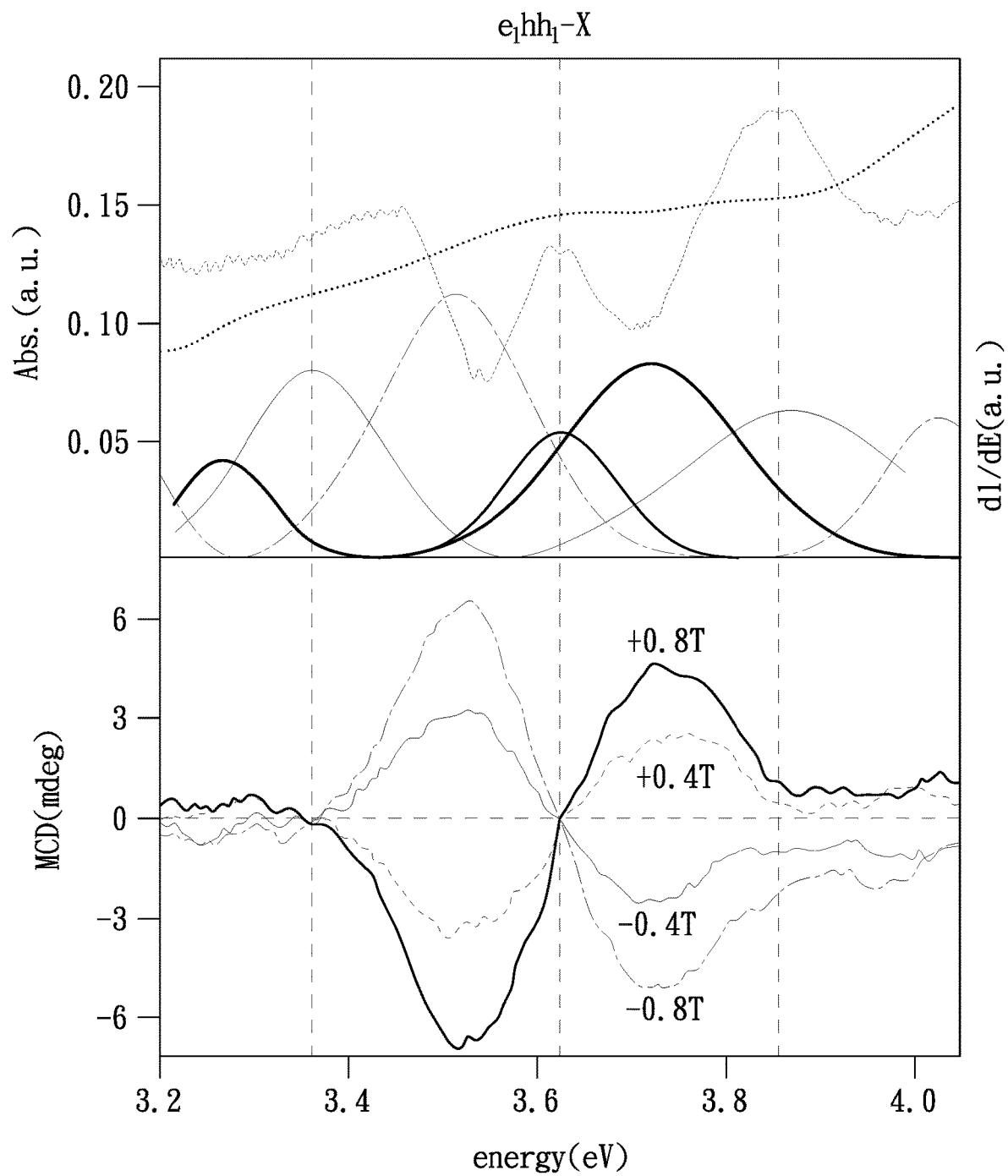
FIG. 4 is a schematic diagram of the results of an absorption spectrum of a manganese ion doped monolayer two-dimensional material and its first-order differential and the related magnetic circular dichroism spectrum under a magnetic field.

FIG. 4 is a schematic diagram of the results of an absorption spectrum of a manganese ion doped monolayer two-dimensional material at 300K and its first-order differential and the related magnetic circular dichroism spectrum under a magnetic field (−0.8T−+0.8T). The upper picture shows the light absorption (dashed line) and its first-order differential (dotted line), and the lower picture shows the corresponding magnetic circular dichroism spectrum. The upper picture shows the absorption spectrum without the magnetic field, and the lower picture shows the absorption difference between left-handed light and right-handed light under the magnetic field.

Using the intensity and the half-width of the absorption peak of the magneto-optical transition, the Zeeman splitting energy under the magnetic field is derived. From the energy level theory, explain the trajectory of electrons outside the nucleus. Electrons may only move on specific and discrete orbits. The electrons on each orbit have discrete energy atomic energy levels, and the energy transition between these energy levels is not affected by the magnetic field. If there is a magnetic field, the energy levels of atoms will split into more energy levels due to different spins. The energy level difference created by the energy asymmetry is called Zeeman splitting.

Next, find the linear relationship between the energy and the magnetic field. The slope of the linear relationship is the effective Lande g factor under the magneto-optical transition. The Lande g factor combines the orbital angular momentum, spin angular momentum, and total electronic angular momentum (L+S) of the atomic energy state, all of which are coupled with the electron spin magnetic moment under a magnetic field to produce contributions. Therefore, the Lande g factor may be obtained by the ratio of the relationship between the Zeeman splitting energy level difference produced by the magnetic field and the magnetic field. When the g value is larger, it means that a relatively larger Zeeman effect may be produced under a smaller magnetic field. The effective Lande g factor is also an important indicator of the application of dilute magnetic semiconductors in spintronic devices. Monolayer semiconductors have atomic-level (<0.3 nm) quantum confinement effects. Through the above-mentioned spectra, it can be known that electrons exhibit strong Zeeman and zero-field energy splitting energies. At room temperature, they have exhibited an effective Lande g factor of the same magnitude that may only be observed at liquid helium temperature. The long life cycle, spin-coupling, and superparamagnetic properties of magnetic semiconductors at room temperature may be applied to spin memories, qubits, polaron lasers and nuclear magnetic resonance imaging in the future, with research potential and application value.

Figure 5:
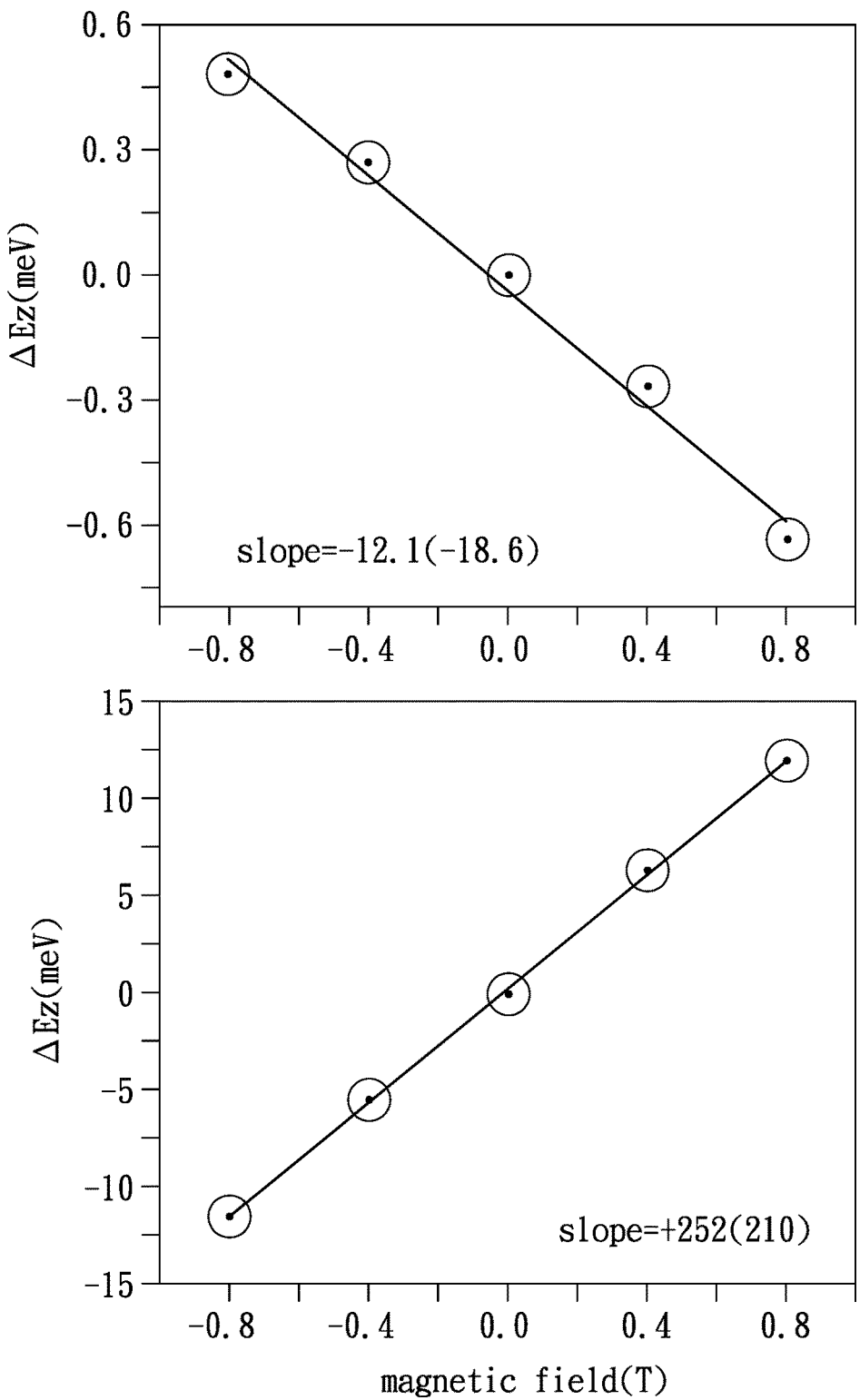
FIG. 5 is a schematic diagram of the results of extracting an effective Lande g factor from a slope of a relationship between a Zeeman splitting energy and a magnetic field of a monolayer two-dimensional material.

FIG. 5 is a schematic diagram of the results of extracting an effective Lande g factor from a slope of a relationship between a Zeeman splitting energy and a magnetic field of a monolayer two-dimensional material. The upper figure of FIG. 5 uses the monolayer two-dimensional material not doped with manganese ions prepared in Embodiment 1, and the lower figure uses the monolayer two-dimensional material doped with manganese ions prepared in Embodiment 2. The slope of the relationship between the magnetic field and the energy is the Lande g factor. The different Lande g factors extracted from the two batches of samples analyzed by the transition overlap method are listed in parentheses in the figure. The undoped manganese material in the upper figure shows a correlation diagram with a smaller slope, and the Zeeman splitting energy is inversely proportional to the direction of the magnetic field. The lower figure shows a correlation diagram with increasing slope of at least one order of magnitude for manganese doped materials. At this time, the manganese ion is subjected to a strong quantum effect, and its Zeeman splitting energy presents a huge Lande g factor, and presents a positive relationship with the magnetic field, indicating that the resonance energy required to flip the electron spin under the magnetic field is lower.

In summary, the preparation method of the monolayer two-dimensional material of the embodiment of the invention uses high temperature solvent method to synthesize a highly crystalline organic-inorganic composite monolayer two-dimensional material with ethylenediamine and metal precursors, effectively doping with four-coordinated manganese ions as the magneto-optical active spin center, and uses the coating method to make the monolayer two-dimensional material form a measurement sample with directional alignment. The electron paramagnetic resonance spectrometer measures the above-mentioned measurement sample with directional alignment in a vertical or parallel magnetic field. The spin center exhibits a high zero-field splitting energy and anisotropic resonance absorption energy spectrum. The measurement of the magnetic circular dichroism spectrum may infer a resonance energy that changes with the magnetic field. Four-coordinated manganese ions have a strong Zeeman effect in the monolayer two-dimensional material, which represents the magneto-optical properties of effectively flipping spin electrons at room temperature and in a low magnetic field.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A preparation method of a monolayer two-dimensional material, comprising:
    providing a metal acetate dihydrate, with a general formula $M(CH_3COO)_2 \cdot 2H_2O$, in which M is metal ion cadmium or zinc;
    dissolving the metal acetate dihydrate in ethylene diamine and heating to 60° C. for two hours to form a metal cation precursor solution;
    providing a chalcogen element powder, in which the chalcogen element powder is selected from sulfur, selenium, or tellurium;
    dissolving the chalcogen element powder and sodium borohydride in ethylene diamine, and standing at room temperature for 24 hours to form a chalcogenide-amine precursor solution;
    mixing the metal cation precursor solution with the chalcogenide-amine precursor solution to form a mixed solution; and
    transferring the mixed solution in a high temperature autoclave for reaction to form the monolayer two-dimensional materials.

2. The preparation method of the monolayer two-dimensional material according to claim 1, wherein the method of forming the metal cation precursor solution comprises dissolving manganese acetate tetrahydrate and metal acetate dihydrate in ethylenediamine at 60° C.

3. The preparation method of the monolayer two-dimensional material according to claim 2, wherein a manganese doping molar concentration percentage in the metal cation precursor solution is between 0-15%.

4. The preparation method of the monolayer two-dimensional material according to claim 1, further comprising mixing the monolayer two-dimensional material with trioctyl phosphine in an oxygen-free environment for purification treatment.

5. The preparation method of the monolayer two-dimensional material according to claim 4, wherein the method of purification treatment comprises after mixing the monolayer two-dimensional material with trioctyl phosphine, adding dimethylformamide, and repeating centrifugal treatment 3-4 times.

6. The preparation method of the monolayer two-dimensional material according to claim 5, wherein the method of purification treatment further comprises after repeating the centrifugal treatment 3-4 times, adding ethanol, and repeating the centrifugal treatment 3-4 times again, and then vacuum drying is used.

7. The preparation method of the monolayer two-dimensional material according to claim 1, wherein the method of transferring the mixed solution in the high temperature autoclave for reaction comprises carrying out the reaction at 120° C.-250° C.

* * * * *